United States Patent
Xu et al.

(10) Patent No.: US 11,322,726 B2
(45) Date of Patent: May 3, 2022

(54) DISPLAY PANEL, DISPLAY SCREEN, AND DISPLAY TERMINAL WITH MULTIPLE LIGHT PATHS AND COMPENSATION LAYER IN GROOVE

(71) Applicants: KunShan Go-Visionox Opto-Electronics Co., Ltd., Kunshan (CN); Yungu (Gu'an) Technology Co., Ltd., Langfang (CN)

(72) Inventors: Lixiong Xu, Kunshan (CN); Junhui Lou, Kunshan (CN)

(73) Assignees: KunShan Go-Visionox Opto-Electronics Co., Ltd., Kunshan (CN); Yungu (Gu'an) Technology Co., Ltd., Langfang (CN)

( * ) Notice: Subject to any disclaimer, the term of this patent is extended or adjusted under 35 U.S.C. 154(b) by 186 days.

(21) Appl. No.: 16/845,089

(22) Filed: Apr. 10, 2020

(65) Prior Publication Data
US 2020/0243801 A1 Jul. 30, 2020

Related U.S. Application Data

(63) Continuation of application No. PCT/CN2019/082625, filed on Apr. 15, 2019.

(30) Foreign Application Priority Data

Sep. 14, 2018 (CN) .......................... 201811071912.2
Sep. 14, 2018 (CN) .......................... 201811071932.X

(51) Int. Cl.
*H01L 51/52* (2006.01)
*H01L 27/32* (2006.01)

(52) U.S. Cl.
CPC ...... *H01L 51/5275* (2013.01); *H01L 27/3246* (2013.01); *H01L 27/3276* (2013.01); *H01L 27/3283* (2013.01); *H01L 51/5253* (2013.01)

(58) Field of Classification Search
CPC ............. H01L 51/5275; H01L 51/5253; H01L 27/3246; H01L 27/3276; H01L 27/3283
See application file for complete search history.

(56) References Cited

U.S. PATENT DOCUMENTS

| 8,883,531 B2 | 11/2014 | Kim et al. |
| 2003/0228740 A1* | 12/2003 | Nagai ................. H01L 27/1214 438/484 |

(Continued)

FOREIGN PATENT DOCUMENTS

| CN | 102914901 A | 2/2013 |
| CN | 102914917 A | 2/2013 |

(Continued)

OTHER PUBLICATIONS

Search Report of International Application No. PCT/CN2019/082625.

(Continued)

*Primary Examiner* — Lex H Malsawma
(74) *Attorney, Agent, or Firm* — Kilpatrick Townsend & Stockton

(57) ABSTRACT

Provided is a display panel, comprising a substrate, and a plurality of film layers sequentially disposed on the substrate. The display panel has m paths orthogonal to a surface of the substrate, and including a first path and a second path comprising different film layers. When a thickness of the film layer is set to a preset thickness and/or when a refractive index is set to a preset refractive index, the display panel allows an externally incident light to enter therein in a direction orthogonal to the surface of the substrate, and pass through the first path and the second path. A difference value between optical lengths of the first path and the second path is an integer multiple of a wavelength of the externally incident light.

18 Claims, 16 Drawing Sheets

(56) References Cited

U.S. PATENT DOCUMENTS

| | | | |
|---|---|---|---|
| 2004/0245531 A1* | 12/2004 | Fuii | H01L 27/156 257/88 |
| 2005/0225232 A1* | 10/2005 | Boroson | H01L 27/3206 313/504 |
| 2006/0214573 A1* | 9/2006 | Maeda | H01L 51/5271 313/506 |
| 2008/0030632 A1 | 2/2008 | Murata | |
| 2010/0320446 A1* | 12/2010 | Kang | H05B 33/10 257/40 |
| 2013/0033659 A1 | 2/2013 | Chung et al. | |
| 2013/0033662 A1 | 2/2013 | Chung et al. | |
| 2013/0188253 A1* | 7/2013 | Nakai | G02F 1/133514 359/584 |
| 2013/0215371 A1* | 8/2013 | Nakahara | G02F 1/134309 349/141 |
| 2014/0061595 A1* | 3/2014 | Kim | H01L 51/5265 257/40 |
| 2017/0207114 A1 | 7/2017 | Maruyama et al. | |
| 2018/0114799 A1 | 4/2018 | Miyake | |

FOREIGN PATENT DOCUMENTS

| | | |
|---|---|---|
| CN | 107505767 A | 12/2017 |
| CN | 101116026 A | 1/2018 |
| CN | 207250521 U | 4/2018 |
| CN | 108089377 A | 5/2018 |
| JP | H09205319 A | 8/1997 |
| JP | 2002122894 A | 4/2002 |
| JP | 2002174813 A | 6/2002 |

OTHER PUBLICATIONS

Written Opinion of International Application No. PCT/CN2019/082625.

Notification of First Office Action of Chinese Application No. 2018110719122.

\* cited by examiner

DISPLAY PANEL, DISPLAY SCREEN, AND DISPLAY TERMINAL WITH MULTIPLE LIGHT PATHS AND COMPENSATION LAYER IN GROOVE

CROSS-REFERENCES TO RELATED APPLICATIONS

The present application is a continuation of International Application No. PCT/CN2019/082625, filed Apr. 15, 2019, which claims priority to Chinese Patent Application No. 201811071912.2, filed Sep. 14, 2018 and to Chinese Patent Application No. 201811071932.X, filed Sep. 14, 2018. All applications are incorporated by reference herein in their entireties for all purposes.

TECHNICAL FIELD

The present application relates to the field of display technologies, and in particular to a display panel, a display screen, and a display terminal.

BACKGROUND

With rapid development of the display terminal, users have an increasingly higher level of demands for the screen ratio, such that the full display screen has received more and more attention in the industry. Full screens are often slotted or perforated to accommodate the elements, for example, bangs screens of Apple Phone iPhone are usually slotted or perforated in the display area corresponding to elements such as cameras and sensors. When the camera is used, external light goes into the camera below the display screen through the slot or hole on the display screen, so as to realize taking a picture. However, neither the bangs screen nor the perforated screen is a true full screen. Therefore, it's in urgent need to develop a true full screen in the industry.

SUMMARY

Based on the above, the present application provides a display panel, a display screen, and a display terminal that can be used for full screen display.

For this, the present application provides the following technical solutions:

An embodiment of the application provides a display panel, comprising
a substrate, and
a plurality of film layers disposed on the substrate in sequence, and at least one of the film layers having a patterned structure,
wherein the display panel has a plurality of light transmitting paths, the number of the light transmitting paths is m, and m is an integer greater than or equal to 2, and the light-transmitting paths extend along a direction orthogonal to a surface of the substrate, the plurality of light transmitting paths include a first path and a second path comprising different film layers, when a thickness of the film layer is set to a preset thickness and/or when a refractive index is set to a preset refractive index, the display panel has an externally incident light entered therein along a direction orthogonal to the surface of the substrate, and passed through the first path and the second path, and a difference value obtained between optical lengths of the first path and the second path is an integer multiple of a wavelength of the externally incident light.

Optionally, at least one of the film layers through which the first path passes defines a groove, the groove has a compensation layer is disposed therein, and the compensation layer is made from a transparent material layer with a thickness less than or equal to a depth of the groove, and the first path longitudinally passes through the groove and the compensation layer.

Optionally, the display panel allows the externally incident light to enter therein along a direction orthogonal to the surface of the substrate and pass through any two paths of the plurality of light transmitting paths, and a difference value obtained between optical lengths of the first path and the second path is an integer multiple of a wavelength of the externally incident light.

Optionally, the display panel has the following setting:

$$L_1 = d_1 * n_1 + d_2 * n_2 + \ldots + d_i * n_i,$$

$$L_2 = D_1 * N_1 + D_2 * N_2 + \ldots + D_j * N_j,$$

$$L_1 - L_2 = a\lambda,$$

wherein $L_1$ represents the optical length of the externally incident light along the first path, i is a natural number representing to the number of the film layers being passed through by the externally incident light, $d_1, d_2, \ldots d_i$ respectively represents the thicknesses of the film layers being passed through, and the $n_1, n_2, \ldots, n$ respectively represents to refractive index of the film layers being passed through; and $L_2$ represents to the optical length of the externally incident light along the second path, j is a natural number representing to the number of the film layers being passed through, $D_1, D_2, \ldots D_j$ respectively represent the thicknesses of the film layers being passed through, and $N_1, N_2, \ldots, N_j$ respectively represent the refractive index of the film layers being passed through; and $L_1-L_2$ represents a difference value between optical lengths of externally incident light along the first path and the second path, and $\lambda$ represents the wavelength of the externally incident light; and when the thickness of the film layer being passed through is set to the preset thickness and the refractive index is set to the preset refractive index, the mark 'a' in the '$L_1-L_2=a\lambda$' is an integer.

Optionally, when $d_1 * n_1 + d_2 * n_2 + \ldots + d_i * n_i = D_1 * N_1 + D_2 * N_2 + \ldots + D_j * N_j$, the difference value of the optical lengths of the first path and the second path is 0.

Optionally, the display panel is an active matrix organic light emitting diode (AMOLED) display panel or a passive matrix organic light emitting diode (PMOLED) display panel, and the film layers comprise a package layer, a second electrode layer, a light emitting layer, a first electrode layer, and a pixel defining layer;

the first path comprises the package layer, the compensation layer, the second electrode layer, the light emitting layer, the first electrode layer, and the substrate;

the second path comprises the package layer, the second electrode layer, the pixel defining layer, the first electrode layer, and the substrate; and the light transmitting paths also comprise a third path comprising the package layer, the second electrode layer, the pixel defining layer, and the substrate.

Optionally, the display panel is the active matrix organic light emitting diode (AMOLED) display panel, and the film layers further comprise a conductive line, and the conductive line is a single-layer line or a multilayer line, and the conductive line comprises at least one of a scanning line, a data line, a power line, and a reset line; and the light transmitting paths further comprise a fourth path comprising the package layer, the second electrode layer, the pixel defining layer, the conductive line, and the substrate.

Optionally, the conductive line is a single-layer line, the conductive line is disposed on the same layer as the first electrode layer, and the conductive line and the first electrode layer are made of the same material, and the fourth path and the second path comprise the same film layers with the same thickness; or the conductive line is the multilayer line, and at least one layer of the multilayer line is disposed on the same layer as the first electrode layer, and the conductive line and the first electrode layer are made of the same material or different materials.

Optionally, the conductive line is a double-layer line comprising a first conductive line and a second conductive line disposed on the same layer, and the second conductive line is disposed between a planarization layer and the substrate, and the first conductive line and the second conductive line are made of the same material as the first electrode layer, and the fourth path comprises the package layer, the second electrode layer, the pixel defining layer, the first conductive line and/or the second conductive line, and the substrate.

Optionally, when a projection of the conductive line on the substrate partially overlaps with a projection of the first electrode layer on the substrate, the light transmitting paths further comprise a fifth path comprising the package layer, the second electrode layer, the light emitting layer, the first electrode layer, the second conductive line, and the substrate.

Optionally, the display panel allows the externally incident light to enter therein along a direction orthogonal to the surface of the substrate and pass through the first path and the third path, and the difference value of the optical lengths of the first path and the third path obtained is an integer multiple of the wavelength of the externally incident light.

Optionally, the display panel is the active matrix organic light emitting diode (AMOLED) display panel, and the film layers further comprise a support layer disposed on the pixel defining layer and a thin film transistor (TFT) structure layer for manufacturing a pixel circuit, and the support layer is a transparent structure, and at least one of the second path, the third path, and the fourth path further comprises the support layer and/or the TFT structure layer, or the support layer is an opaque structure, and the TFT structure layer is disposed below the support layer.

Optionally, the display panel is a passive matrix organic light emitting diode display panel, and the film layers further comprise an isolation column disposed on the pixel defining layer, and the light transmitting paths further comprise a sixth path comprising the second electrode layer, an isolation column, the pixel defining layer, and the substrate, and the isolation column is made of transparent material.

Optionally, the display panel is a flexible screen or a hard screen encapsulated with a thin film and the package layer comprises a thin film package layer comprising an organic material package layer, and the compensation layer is made of the organic material for encapsulation, and the thickness of the organic material package layer in the first path is greater than the thickness of the organic material package layer in other paths of the plurality of light emitting paths; or the display panel is a hard screen encapsulated with a glass powder and the package layer comprises a vacuum gap layer and a package substrate, and the thickness of the vacuum gap layer in the first path is greater than or equal to the thickness of the vacuum gap layer in other paths of the plurality of light emitting paths, Optionally, after adjusting the thickness and/or the refractive index of one or more film layers that are different with each other in the first and second paths, the externally incident light passes through the first and second paths, and the resulting difference value between the optical lengths of the first and second paths is an integer multiple of the wavelength of the externally incident light.

Optionally, the wavelength of the externally incident light is 380 to 780 nanometers.

Optionally, the wavelength of the externally incident light is 500-600 nanometers.

Optionally, the wavelength of the externally incident light is 550 nanometers.

The embodiment of the present application also provides a display screen, comprising at least one display area; and the at least one display area comprising a first display area, and a photosensitive device disposed below the first display area; and the display panel according to any one of claims 1 to 18 is disposed in the first display area, and the at least one display area is used to display a dynamic or static picture.

The embodiment of the present application also provides a display terminal, comprising:

an apparatus body, having a device area;

the display screen covering the apparatus body;

and the device area is located below the first display area and provided with a photosensitive device for collecting light through the first display area; and the device area is a groove area, and the photosensitive device comprises a camera and/or a light sensor.

The technical solution of this application has the following advantages:

(1) In the display panel provided in the embodiment of the present application, the film layer has a patterned structure, and at least one of the film layers has a groove, and a compensation layer is disposed in the groove; when the display panel allows externally incident light to enter in a direction orthogonal to the surface of the substrate, the path that the light passes through the groove and the compensation layer of the first film layer is the first path. By setting the compensation layer and controlling the thickness and the refractive index of the compensation layer, the difference value between the optical lengths of the first path and the second path is an integer multiple of the wavelength of the externally incident light. In the technical solution, since the difference value between the optical lengths of the first path and the second path is an integer multiple of the wavelength of light, when the light emits from the display panel after passing through the first path and the second path, the phase difference of the lights is zero, and since the phase difference between the lights with the same phase after passing through the display panel is one of the reasons for diffraction occurrence, using the technical solution, the phases of the lights are still the same and no phase difference is generated after the lights with the same phase pass through the display panel through the first path and the second path, and the diffraction phenomenon caused by the phase difference is eliminated, so that an image distortion due to the above-mentioned diffraction does not occur after the light passes through the display panel, which improves the sharpness of the image perceived by the camera behind the display panel, and enables the photosensitive device behind the display panel to obtain clear and real images, thereby realizing full-screen display.

(2) In the display panel provided in the embodiment of the present application, there are multiple paths for the lights to pass through the display panel, and the number of paths is determined according to the types of paths of the display panel to be passed by the lights that are vertical to display panel, and different paths comprise different film layers. When there are multiple paths, the difference value between the optical lengths formed by the incident light passing through two of the multiple paths is an integer multiple of the wavelength of the incident light. In a preferred solution, there are multiple paths such as three, four, and five paths. The difference value between the optical lengths formed by the incident light passing through any two different paths is an integer multiple of the wavelength of the incident light.

In this way, the diffraction caused by light passing through the display panel via these paths can be effectively reduced. The more paths are qualified are, the weaker the diffraction phenomenon caused by the lights passing through the display panel will be. As the most preferred solution, the difference value between the optical lengths formed by light passing through any two different paths is an integer multiple of the wavelength of the incident light. In this way, the diffraction caused by the phase difference after the light passes through the display panel can be eliminated, therefore, the diffraction phenomena can be greatly reduced.

(3) The display panel in the embodiment of the present application can be a passive matrix organic light emitting diode (PMOLED) or an active matrix organic light emitting diode (AMOLED). There are different paths when the lights pass through the display panel according to different film layer structures of the display panel. By adjusting the thickness and/or refractive index of one of the film layers in a specific path, the difference value between an optical length of the light passing through the path and the optical length of another path or the other paths is an integer multiple of the wavelength of the light. In particular, the thickness of the film layer can be adjusted according to practical need. If the thickness can't be adjusted under the condition of meeting the performance requirements, the material of the film layer can be adjusted, thereby changing the refractive index of the film layer, and realizing the above purpose.

(4) In the display panel in the embodiment of the present application, the thickness of the pixel defining layer or the thickness of the electrode layer can be preferentially adjusted, since the thickness of the pixel defining layer is higher than that of other film layers, and the thickness is easy to be adjusted. The optical length of path to be passed by the light can be adjusted by adjusting the thickness of the pixel defining layer under the condition of meeting the performance requirements. In addition, the material of the pixel defining layer can be adjusted to change the refractive index of the pixel defining layer, and the optical length of path to be passed by the light can be adjusted by adjusting the refractive index of the pixel defining layer, so that the diffraction caused by the light passing through the display panel can be reduced.

(5) An embodiment of the present application further provides a display screen and a display terminal having the same. If the display panel is used, and photosensitive devices such as a camera or a photosensitive device are disposed below the display panel, diffraction can be better eliminated, so that the camera and photosensitive device can capture more real incident light.

BRIEF DESCRIPTION OF THE DRAWINGS

In order to more clearly illustrate the embodiments of the present application, the drawings used in the embodiments or the description of the prior art will be briefly described below. Obviously, the drawings attached in the following description only represent some embodiments of the present application, and those skilled in the art can obtain other drawings based on these drawings without any creative intellectual work.

DETAILED DESCRIPTION OF THE INVENTION

Figure 1:
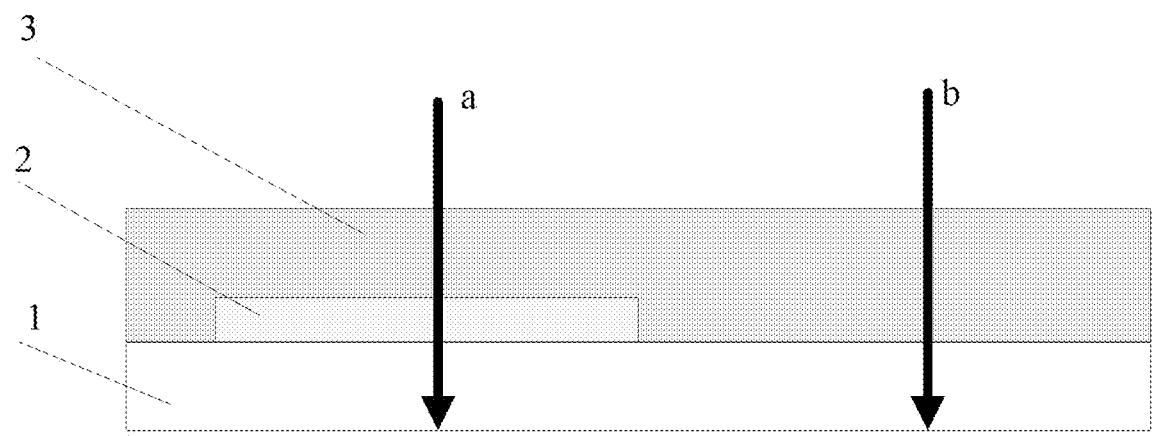
FIG. 1 is a structural view showing a display panel in an embodiment of the present application.

In order to make the objects, technical solutions and advantages of the application more clear, the present application will be further described in detail below with reference to the drawings and embodiments. It should be understood that the embodiments described herein are merely illustrative of the application and are not intended to limit the scope of the present application.

In the description of the present application, it should be understood that the terms "center", "transverse", "upper", "lower", "left", "right", "vertical", "horizontal", "top", "bottom", "inside" and "outside" indicate orientation or positional relationship which are based on the orientation or positional relationship shown in the drawings, and it is merely for convenience of describing the present application and simplifying the description, rather than indicating or implying that the indicated device or element must have a particular orientation, and be constructed and operated in a particular orientation. Therefore these terms should not be understood as limiting the scope of the present application.

In addition, it should be noted that when an element is referred to as "formed on another element", the element can be directly connected to other element or a middle element may be present at the same time. When an element is considered to be "connected" to another element, it can be directly connected to the other element, or a middle element may be present at the same time. In contrast, when an element is referred to as being "directly on" another element, there is no middle element.

The full screen is not a true full screen. However, during the research, it was found that if the display panel is directly covered on a light sensitive device such as a camera, the display panel located above the light sensitive device such as the camera is required to have a high light transmittance. However, It was further discovered by the inventor that when a photosensitive device such as a camera is disposed below a transparent display panel, the photos captured are blurred. Further, the inventor found that the reason of this problem is that there are patterned film layer structures in the display screen, and when external lights pass through these patterned film layer structures and diffraction of the lights will occur, resulting in blurred photos.

Further, different sectional structures are formed in the area comprising the patterned film layer and the area without the patterned film layer, so when light enters the display screen and reaches the photosensitive device, the light paths passed through are different. When light passes through different areas of the transparent screen, there are differences in the optical lengths formed by the light passing through the different areas due to the differences of the refractive indexes and thickness of different film layer structures. When the lights pass through different areas, the lights having the same phase originally will turn to have a phase difference. The phase difference is one of the important reasons for diffraction occurrence, and the phase difference will cause significant diffraction phenomena, which will cause diffraction fringes after the lights pass through the display panel, making the picture distorted and blurred.

The embodiment of the present application provides a display panel, as shown in FIG. 1, the display panel comprises a substrate 1, and a first film layer 2 and a second film layer 3 disposed on the substrate 1 in sequence. The first film layer 2 and the second film layer 3 are called film layers. The first film layer 2 has a patterned structure and the second film layer 3 is a film layer disposed above the first film layer 2. Since the first film layer has a patterned structure, a plurality of light-transmitting paths, or called paths, are formed in the display panel. Each of light-transmitting paths comprises different film layers. In this embodiment, a path a and a path b, or referred to as a first path and a second path are formed in the display panel. The path, or called the light transmitting path referred in this application means the path through which the incident light enters the display panel along a direction orthogonal to the surface of the substrate. The path, or called the light transmitting path, by which the light passes through the display panel mentioned later means the path by which the light passes through the display panel in a direction orthogonal to the surface of the substrate. In the present application, the path a and path b respectively comprise different film layers. The path a comprises the second film layer 3, the first film layer 2, and the substrate 1. The path b comprises the second film layer 3 and the substrate 1. The difference value between the optical lengths of the path a and the path b to be passed by the lights is an integer multiple of the wavelength of the light.

The optical length is equal to the refractive index of the medium multiplied by the distance that the light travels through the medium. The calculation formula of the optical length is: optical length=refractive index×distance. According to the calculation formula, the light respectively has a refractive index of substrate 1, the first film layer 2, and the second film layer 3 as $n_1$, $n_2$, and $n_3$, and the thickness of the substrate 1 is $d_1$, the thickness of the first film layer is $d_2$, and the second film layer has a thickness of $d_a$ in the path a, and the second film layer has a thickness of $d_b$ in the path b. In this embodiment, $d_2+d_a=d_b$, and the wavelength of light is $\lambda$, then the optical length $L_a=n_1 \times d_1 + n_2 \times d_2 + n_3 \times d_a$; $L_b=n_1 \times d_1 + n_3 \times d_b$. The difference value between the optical lengths of path a and path b is $L_a-L_b=x\lambda$, and x is an integer, x could be a positive integer, a negative integer, or zero. The light herein can be any one of monochromatic light or white light among visible lights. The difference value $L_a-L_b$ is equal to 0. In other words, difference value between the optical length of the path a and the path b is equal to 0 which is better to be performed when compared with an integer multiple of the wavelength of light.

The display panel in this solution has a patterned structure in the film layer, and light can pass through the display panel in two different paths. By reasonably setting the thicknesses of the first film layer and the second film layer, and reasonably selecting the refractive indexes of the first films and the second film layer, the difference value between the optical lengths of the two different paths to be passed by the light is an integer multiple of the wavelength of the light. Since the difference value between the optical lengths of the two different paths is an integer multiple of the wavelength of the light, when the lights pass through the display panel via the two different paths, the phase difference is zero. Since the phase difference caused by the lights in the same phase passing through the display panel is one of the important reasons for diffraction occurrence, when using the technical solution, the phases of the lights are still the same and no phase difference is generated after the lights in the same phase pass through the display panel via the two different paths. The diffraction phenomenon caused by the phase difference is eliminated, so that the above-mentioned image distortion due to diffraction does not occur after the light passes through the display panel, which improves the sharpness of the image perceived by the camera behind the display panel, and enables the photosensitive device behind the display panel to obtain clear and real images, thereby realizing full-screen display.

Optionally, one or more of the film layers have a patterned structure, so that when light passes through the display panel vertically, a plurality of the paths are formed. Each of the path comprises different film layers. The difference value between the optical lengths of at least two of the paths to be passed by the lights is an integer multiple of the wavelength of the light, so that the diffraction phenomenon of light after passing through at least two paths can be reduced. In a further solution, there may be several paths such as three, four, and five paths, and the difference value between the optical lengths of any two paths is an integer multiple of the wavelength of the incident light. In this way, the diffraction phenomenon of light after passing through the display panel via these paths can be effectively reduced. The more paths meet the above requirements are, the weaker the diffraction phenomenon after the light passing through the display panel will be. As a further preferred solution, when the display panel allows the externally incident light to enter therein in a direction orthogonal to the surface of the substrate, and pass through any two of the several paths, the difference value of the optical lengths obtained is an integer multiple of the wavelength of the externally incident light.

In this way, the phase difference caused by the phase diversity after the light passes through the display panel can be eliminated, and the occurrence of diffraction phenomena can be greatly reduced.

Figure 2:
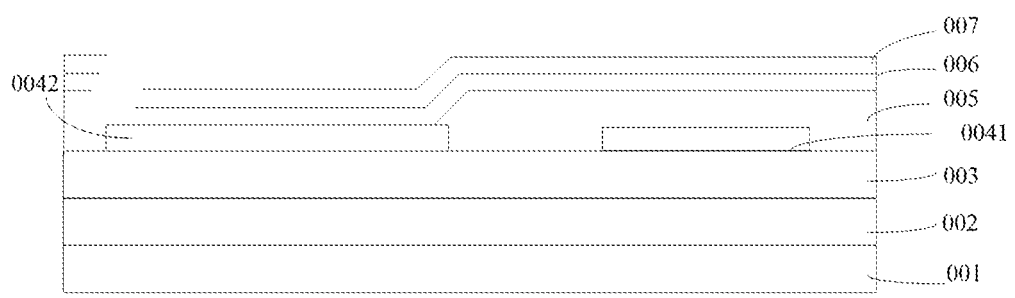
FIG. 2 is a structural view showing a display panel in another embodiment of the present application.

As a specific embodiment, the display panel in this embodiment is an AMOLED display panel. As shown in FIG. 2, the display panel comprises a substrate 001, a laminate 002, a planarization layer 003, a conductive line 0041, an anode layer 0042, a pixel defining layer 005, a light emitting structure layer 006, and a cathode layer 007.

The substrate 001 here can be a rigid substrate, e.g. a transparent substrate such as a glass substrate or a quartz substrate; the substrate 001 can also be a flexible transparent substrate, such as a PI film, so as to improve the transparency of the device. Since the substrate is the same in all paths through which the light passes vertically, the substrate has no substantial effect on the difference between the optical lengths of different paths to be passed by the light.

A laminate 002 is disposed on the substrate 001, and the laminate here forms a pixel circuit, such as 2T1C, 7T1C and other pixel circuits. Specifically, it comprises one or more switching devices and capacitors and other devices. A plurality of switching devices and capacitors are connected in series or in parallel, which is not limited. The switching device can be a thin film transistor (TFT), the thin film transistor can be an oxide thin film transistor or a low temperature poly silicon thin film transistor (LTPS TFT), and the thin film transistor is preferably an indium gallium zinc oxide thin film transistor (IGZO TFT). Optionally, the switching device can also be a metal-oxide semiconductor field effect transistor (MOSFET)), and can also be other components with conventional switching characteristics, such as an insulated gate bipolar transistor (IGBT), etc., as long as the components can implement the switching function and can be integrated into the display panel, they fall into the protection scope of this application.

A pixel driving circuit comprises a variety of devices, thus forming a multilayer film structure which comprises a source, a drain, a gate, a gate insulating layer, an active layer, an interlayer insulating layer, etc. Each film layer is formed with a patterned film layer structure. In different paths, light passes through different paths, so the optical length of the path through which light passes can be adjusted by adjusting the thickness or refractive index of each film layer in the pixel circuit. In addition to adjusting the film layers of each path in the laminate 002, other film layers can also be adjusted to work together for adjusting the optical length of the path to be passed by the light.

A planarization layer 003 is disposed on the laminate 002, and a flat plane is formed by the planarization layer 003, which is convenient for setting electrodes and lines, etc. Since the laminate 002 has a patterned structure, the thickness of the planarization layer 003 is different at different area. By adjusting the thickness and refractive index of different area of the planarization layer, the optical lengths of different paths can be adjusted.

An anode layer 004 and a conductive line 0041 are disposed on the planarization layer 003. The anode layer 0042 and the conductive line 0041 in FIG. 2 are disposed on the same layer. Optionally, the anode layer 0042 and the conductive line 0041 can be disposed on different layers. The conductive lines comprise at least one of the scan lines, data lines, power lines, and reset lines. The scan lines may comprise a SCAN line and an EM line, and the data line is $V_{data}$, the power line is VDD or VSS, and the reset line is $V_{ref}$. The conductive line may be a layer or a multilayer of conductive lines disposed on the planarization layer, and the conductive line may be a multilayer of conductive lines arranged at intervals and crossing each other. The anode layer 0042 and the conductive line 0041 may be made of transparent conductive materials. Indium tin oxide (ITO), indium zinc oxide (IZO), or silver-doped oxide, Indium tin oxide (Ag+ITO), or silver-doped indium zinc oxide (Ag+IZO) may be generally used. Preferably the conductive material is indium zinc oxide due to the mature ITO process and low cost. Further, in order to reduce the resistance of each conductive line while ensuring high light transmittance, materials such as aluminum-doped zinc oxide, silver-doped ITO, or silver-doped IZO are used as the transparent conductive materials.

Both the thickness and the refractive index of the anode layer 0042 and the conductive line 0041 can be adjusted. By adjusting the thickness or the refractive index or adjusting the thickness and the refractive index at the same time, the optical length of the path to be passed by the light can be adjusted, so that the difference value between the optical lengths of the path and other paths meet the above requirements. When the anode layer 0042 is ITO, the thickness of the anode layer 0042 is generally in the range of 20 nm to 200 nm, and the thickness of the ITO layer can be adjusted within this range. The conductive lines 0041 and the anode layer 0042 can be prepared separately, and their thickness and refractive index can be adjusted separately. If the lines have a multilayer structure, the thickness and/or refractive index of each layer of the lines can also be adjusted separately. If they are formed in the same layer, the thickness and refractive index of the conductive line 0041 and the anode layer 0041 can be adjusted at the same time.

In the present embodiment, the conductive line 0041 and the anode layer 042 are disposed on the same layer. In other embodiments, when the conductive lines 0041 are a multilayer of lines, there may be one layer of the conductive line disposed on the same layer as the anode layer, and the materials of the line and the anode layer can be the same or different.

A pixel defining layer 005 is disposed on the anode layer 0042 to limit the position of the pixel, and a pixel opening is formed on the pixel defining layer 005. The pixel defining layer 005 has a relatively large thickness to allow a large adjustable range. The pixel defining layer 005 generally has a thickness of 0.3-3 micrometers, and the thickness of the pixel defining layer 005 can be adjusted within this range. Therefore, it is preferable to adjust the thickness of the pixel defining layer 005 so that the optical length meets the above requirements. If adjusting the thickness of the pixel defining layer 005 alone cannot meet the requirements, the materials of the pixel defining layer 005 can be adjusted together, thus adjusting its refractive index; or the thickness and refractive index of the pixel defining layer 005 may be adjusted at the same time, so as to adjust the optical length of the path to be passed by the light.

Figure 3:
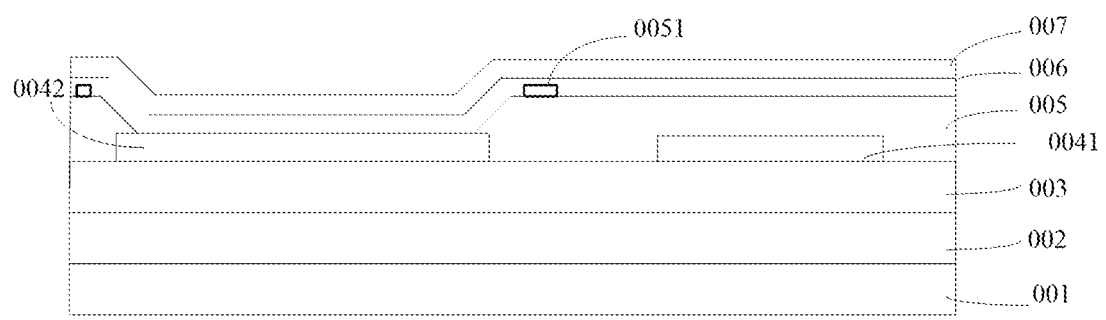
FIG. 3 is a structural view showing a display panel in another embodiment of the present application.
Figure 4:
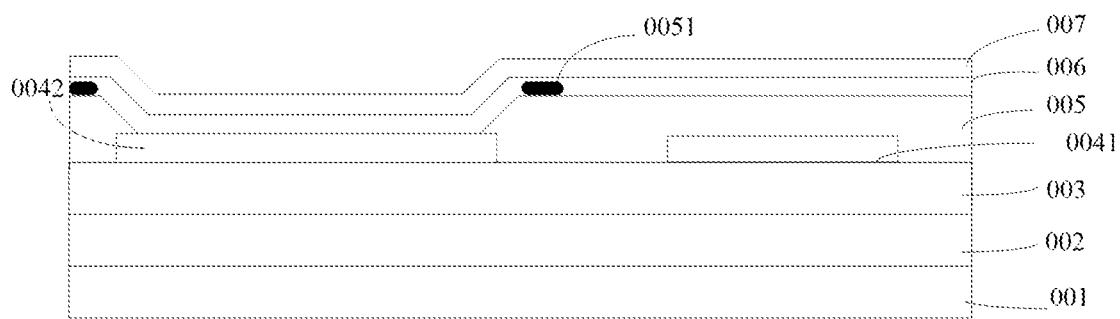
FIG. 4 is a structural view showing a display panel in another embodiment of the present application.

In some embodiments, a support layer 0051 is disposed above the pixel defining layer 005 for supporting a mask during a production process. As shown in FIG. 3, if the support layer 0051 is a transparent structure, for the light path passing through the support layer 0051, the optical length of the path can also be adjusted by adjusting the thickness and refractive index of the support layer 0051. Since the pixel circuit structure in the laminate 002 is relatively more complicated, and the adjustment of each film layer is also relatively more complicated, the support layer 0051 can also be provided as an opaque structure. As shown in FIG. 4, if a black opaque structure is used (a black opaque support layer, referred to as spacer or SPC), and one or more TFT structures in the pixel circuit can be set below the black support layer 0051 so that the light does not pass through a plurality of film layer structures in the pixel circuit when it passes through the display panel. The process of adjusting the optical lengths of different paths is simplified while avoiding the diffraction phenomenon caused by the patterned structure of the film layer.

A pixel opening is formed on the pixel defining layer 005, and a light emitting structure layer 006 is disposed in the pixel opening and above the pixel defining layer 005. In an organic light-emitting diode (OLED), the light emitting structure layer 006 generally comprises a light extraction layer, an electron injection layer, an electron transport layer, a hole blocking layer, a light emitting layer, a hole transport layer, and a hole injection layer. All the layers are arranged as an entire surface except for the light-emitting layer, so that all the remaining layers except for the light-emitting layer, have no effect on the difference value between the optical lengths of the paths to be passed by the lights. The light-emitting layer is disposed in the pixel opening. Different light-emitting sub-pixels comprise different light-emitting materials, including red light-emitting materials, blue light-emitting materials, and green light-emitting materials. As to different light-emitting sub-pixels, the optical length of the paths to be passed by the light can also be adjusted by adjusting the thickness or refractive index of the light-emitting materials in the light-emitting layer, or adjusting the thickness and refractive index of the light-emitting materials at the same time.

Because the overall thickness of the light emission structure layer 006 is small, the adjustable range of the light-emitting layer is small, and the optical length can be adjusted through cooperation with other film layers to avoid the separate adjustment to meet the above requirements.

Figure 5:
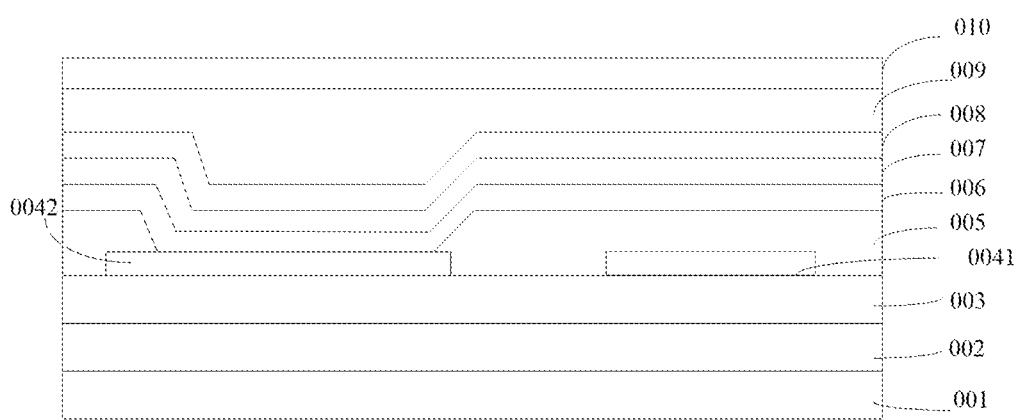
FIG. 5 is a structural view showing a display panel in another embodiment of the present application.

A cathode layer 007 is disposed on the light emission structure layer 006. Since the cathode layer is arranged as an entire surface, the cathode layer has no substantial effect on the difference value between the optical lengths of the paths to be passed by the lights. A light extraction layer 008 can be further disposed above the cathode layer 007. As shown in FIG. 5, the light extraction layer 008 can be omitted in some embodiments.

A package layer is disposed on an external side of the light extraction layer 008. The package layer can be packaged with a hard screen or an organic thin film. The display panel in FIG. 5 is a hard screen packaged with a glass frit (i.e., frit package). The package layer comprises a vacuum gap layer 009 and a package substrate 010. The vacuum gap layer 009 is filled with an inert gas, and the package substrate is a package glass.

In the display panel shown in FIG. 5, when lights pass through the display panel, a plurality of light paths can be formed. Since the display panel has two types of emission structure comprising a top emission structure and a bottom emission structure. If the display panel has a top emission structure, a side to be packaged faces outward, the substrate is inside, and the camera is disposed below the substrate. If the display panel has a bottom emission structure, a side where the substrate located faces outward and a side to be packaged faces inward, and the camera is disposed below the package glass. The display panel is a transparent display panel. When a camera disposed below the display panel works, pixels in the camera area do not emit light, so as to facilitate the transmission of external lights.

Figure 6:
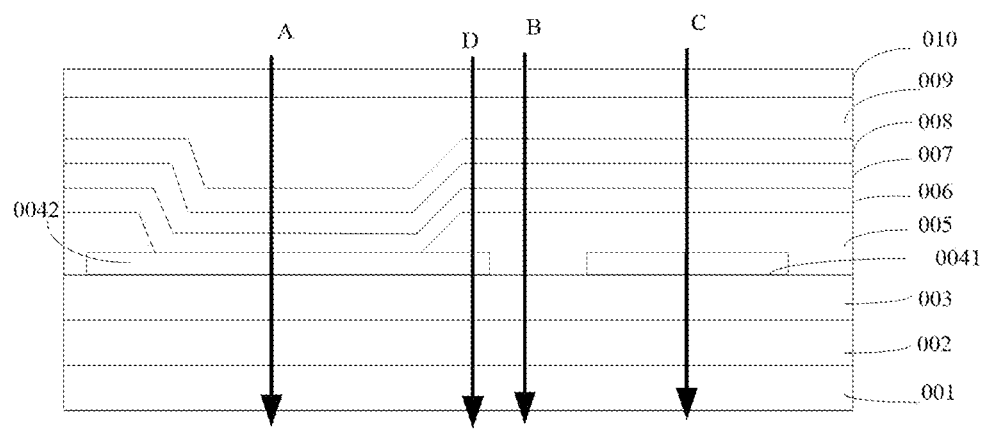
FIG. 6 is a structural view of light passing through a display panel in another embodiment of the present application.

Regardless of a top emission structure or a bottom emission structure, the paths of the light passing through the panel are the same. The top light emission structure is taken as an example for description. Lights enter the display screen from one side of the package glass 010, and when the lights pass through the display panel, various paths are formed, as shown in FIG. 6.

Path A sequentially passes layers comprising a package substrate 010, a vacuum gap layer 009, a light extraction layer 008, a cathode layer 007, a light emitting structure layer 006, an anode layer 0042, a planarization layer 003, a laminate 002, and a substrate 001.

Path B sequentially passes layers comprising a package substrate 010, a vacuum gap layer 009, a light extraction layer 008, a cathode layer 007, a light emitting structure layer 006, a pixel defining layer 005, a planarization layer 003, a laminate 002, and a substrate 001.

Path C sequentially passes layers comprising a package substrate 010, a vacuum gap layer 009, a light extraction layer 008, a cathode layer 007, a light emitting structure layer 006, a pixel defining layer 005, conductive lines 0041, a planarization layer 003, a laminate 002, and a substrate 001.

The path D sequentially passes layers comprising a package substrate 010, a vacuum gap layer 009, a light extraction layer 008, a cathode layer 007, a light emitting structure layer 006, a pixel defining layer 005, an anode layer 0042, a planarization layer 003, a laminate 002, and a substrate 001.

The thickness of the vacuum gap layer 009 in the path A is larger than the thickness of the vacuum gap layer 009 in the other paths. As to the path C and path D, if the anode layer 0042 and the conductive line 0041 are formed on the same layer, the path C and the path D are the same. If the anode layer 0042 and the conductive line 0041 are different layers prepared separately, the path C and the path D are not the same.

The optical length of the path A to be passed by the light is $L_A$, the optical length of the path B to be passed by the light is $L_B$, the optical length of the path C to be passed by the light is $L_C$, and The optical length of the path D to be passed by the light is $L_D$. By adjusting the thickness or refractive index of one or more film layers, one or more of the difference value between $L_A$, $L_B$, $L_C$, and $L_D$ is an integer multiple of the wavelength.

Here, take $L_A$, $L_B$, $L_C$ as examples.
$L_A - L_B = x_1 \lambda$; $x_1$ is an integer;
or $L_B - L_C = x_2 \lambda$; $x_2$ is an integer.

Certainly, the above formulas can also meet the requirements: $L_A - L_B = x_1 \lambda$ and $L_B - L_C = x_2 \lambda$, and $x_1$ and $x_2$ are integers, which can be positive or negative integers or zero. In this way, the difference value between the optical lengths of the paths A, B, and C is an integer multiple of the wavelength of light and after the light passes through the three paths of path A, path B, and path C, the phases of the incident lights are the same as the phases of the emitted lights, which can greatly reduce the occurrence of diffraction phenomena.

The calculation formula of the above-mentioned optical lengths $L_A$, $L_B$, and $L_C$ are as follows:
$L = d_1 * n_1 + d_2 * n_2 + \ldots + d_i * n_i$, where L represents the optical length, i represents the number of structural layers in the path through which light passes, and $d_1, d_2, \ldots, d_i$ respectively represent the thickness of each structure layer in the path through which light passes; $n_1, n_2, \ldots, n_i$ respectively represent the refractive indices of each structural layer in the path through which light passes.

By measuring the thickness and refractive index of each layer, the optical length of each path can be calculated.

In order to adjust the film layers in the path to meet the requirements of the above-mentioned difference values between the optical lengths, it is necessary to firstly determine which film layers in the layer affect the optical length. Although each path passes through a plurality of layers, if the paths comprise the same film layers, and the materials and thickness of the film layers are the same, the difference values between the optical lengths of two different paths will not be affected when calculating the difference value between the optical lengths. Only when the paths comprise the film layers made of different materials, or the film layers having the same material but different thicknesses, the difference values between the optical lengths will be affected.

Specifically, as to the path A, the path B, the path C, and the path D, the light emitting structure layer 006 in the path A comprises a light-emitting layer, but the light emitting structure layers 006 in the path B, the path C, and the path D don't comprise the light emitting layer. by adjusting the thickness and/or the refractive index of the light emitting layer in the light emitting structure layer, the difference values between the optical lengths of the path A, and the path B, C, or D can be adjusted.

In addition, as to the path A and the path B, the substrate 001, the package substrate 010, the light extraction layer 008, and the cathode layer 007 are made of the same materials and have the same thickness, so these layers may not be considered. The layers in the path A different from that in the path B are the vacuum gap layers 009 (comprised in both the path A and the path B but having different thicknesses), the pixel defining layer 005 (comprised in the path B, but not in the path A), and the anode layer 0042 (comprised in the path A, but not in the path B). Since the thicknesses of the vacuum gap layer 009 in the path A and path B are related to the thickness of the pixel defining layer 005. If the thickness of the pixel defining layer 005 is adjusted, a thickness difference between the vacuum gap layers 009 in the path A and the path B will be adjusted accordingly. It can be found that the film layers mainly affecting the path A and path B are the anode layer 0042 and the pixel defining layer 005. By adjusting the thickness and/or the refractive index of the anode layer 0042, or adjusting the thickness and/or the refractive index of the pixel defining layer 005, or adjusting the thickness and/or the refractive index of the anode layer 0042 and the pixel defining layer 005 at the same time, the difference value between the optical lengths of the path A and the path B is an integer multiple of the wavelength of the light.

Certainly, in the above path A and the path B, the light emitting layers in the light emitting structure layer 006 are also different, and the light emitting layer in the pixel opening and the light emitting layer outside the pixel opening may be different, and the optical length of the path can be further adjusted by adjusting the light emitting layer. In addition, the film structures of the planarization layer 003 and the laminate 002 in the path A and the path B can also be different, and the optical length can be adjusted by adjusting the thickness and/or the refractive index of different film layers. Since the pixel circuit structure in the inorganic insulating layer is complicated, a black support layer 0051 can also be disposed on the switching device of the pixel circuit, so that light does not pass through the pixel circuit, avoiding the effect of the light on the performance of the pixel circuit, and at the same time, avoiding of light diffraction caused by the existence of various layers of the pixel circuit.

As to the paths B and C, the main difference of the path B from the path C is that the path C comprises a conductive line 0041, and the thickness of the pixel defining layer 005 in the path C is different from the thickness of the pixel defining layer 005 in the path B. Therefore, by adjusting the thickness and refractive index of the conductive line 0041, the difference value between the optical lengths of the path B and the path C is an integer multiple of the wavelength of the light. The conductive lines in the path C can also be double-layer lines including a first conductive line and a second conductive line disposed on the same layer, and the first electrode layer is an anode layer. The second conductive line is disposed between the planarization layer and the substrate. By adjusting the thickness and/or the refractive index of the first conductive line and the second conductive line, the difference value obtained between the optical lengths is an integer multiple of the wavelength of the externally incident light after the externally incident light passes through the path B and the path C.

The difference between path A and path C lies in the package layer, the pixel defining layer 005, the anode layer 0042, and the conductive line 0041 in the groove. The thickness of the package layer in the groove is determined by the thickness of the pixel defining layer 005, therefore the thickness or refractive index of the layer 005 can be adjusted, or the thickness and refractive index of the pixel defining layer 005 are adjusted at the same time. If the anode layer 0042 and the conductive line 0041 are arranged in the same layer, the difference value between the optical lengths of the paths A and C will not be substantially affected by the anode layer 0042 and the conductive line 0041. If the anode layer 0042 and the conductive line 0041 are arranged in different layers, then the difference value between the optical lengths of the path A and the path C can also be adjusted by adjusting the thickness and/or the refractive index of the anode layer 0042 and the conductive line 0041.

The difference between path A and path D lies in the package layer and the pixel defining layer 005 in the groove. The thickness of the package layer in the groove is determined by the thickness of the pixel defining layer 005, so the thickness or refractive index of the pixel defining layer 005 can be adjusted, or the thickness and refractive index of the pixel defining layer 005 can be adjusted at the same time, so as to adjust the difference value between the optical lengths of the paths A and D.

The difference between path B and path D is the pixel defining layer 005 and the anode layer 0042, so the thickness and/or refractive index of the pixel defining layer 005 and the anode layer 0042 can be adjusted to adjust the difference value between the optical lengths of the paths B and D.

The difference between path C and path D lies in the anode layer 0042 and the conductive line 0041. If the anode layer 0042 and the conductive line 0041 are arranged on the same layer, the optical lengths of the path A and the path C are the same, and there is no difference between optical paths. If the anode layer 0042 and the conductive line 0041 are arranged on different layers, the difference value between the optical lengths of the path C and the path D can also be adjusted by adjusting the thickness and/or the refractive index of the anode layer 0042 and the conductive line 0041.

When the supporting layer 0051 is a transparent structure, the path B, path C, and path D can comprise a supporting layer, and the path B, path C, and path D may further comprise a TFT structure layer which can be used to form a pixel circuit. Since the TFT structure layer comprises a plurality of layers, different layers of the TFT structure will exist in path B, path C, and path D according to the specific structure. Since the support layer 0051 is disposed on the pixel defining layer 005, the support layer 0051 does not appear in path A.

The conductive lines in the above embodiment can be a single-layer line or a multilayer line. The conductive lines comprise at least one of a scan line, a data line, a power line, and a reset line. The scan line may comprise a SCAN line and an EM line. The data line is $V_{data}$, the power line is VDD or VSS, and the reset line is $V_{ref}$. Optionally, the conductive line can also be a double-layer line, for example the double-layer line comprises a first conductive line and a second conductive line disposed on the same layer, and the second conductive line is disposed between the planarization layer and the substrate. The first conductive line and the second conductive line are made of the same material as the first electrode layer, the package layer, the second electrode layer (i.e., the cathode layer), the pixel defining layer, the first conductive line and the substrate form a light path; the package layer, the second electrode layer, the pixel defining layer, the second conductive line, and the substrate can form another light path; and the package layer, the second electrode layer, the pixel defining layer, the first conductive line, the second conductive line, and the substrate can form another light path on an overlapping portion of the projections of the first conductive line and the second conductive line. When a projection of the conductive line on the substrate partially overlaps with a projection of the first electrode layer on the substrate, a path through which the light passes may comprise a package layer, a second electrode layer, a light emitting layer, a first electrode layer, a second conductive line, and a substrate.

With reference to FIG. 6, based on the above embodiments, preferably the thickness of the anode layer in the path A and the thickness of the pixel defining layer in the path C are adjusted, so that the optical lengths of the paths A and the path C are the same in an AMOLED display panel disclosed in another embodiment of the present application.

Figure 7:
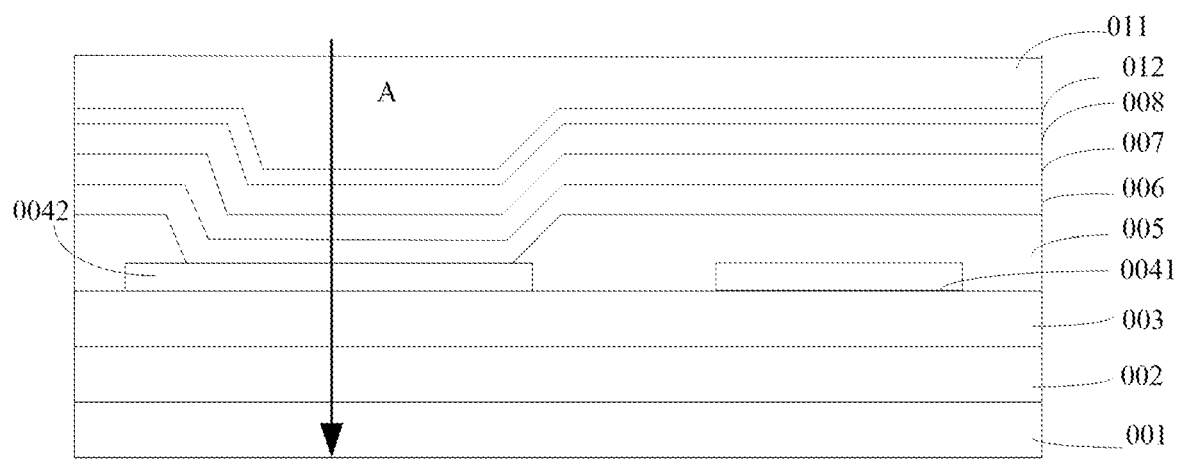
FIG. 7 is a structural view of a display panel in another embodiment of the present application.

In addition to the above-mentioned hard package method, a thin film package method can also be adopted. As shown in FIG. 7, an external side of the light extraction layer 008 is thin-film packaged to form a thin-film package layer. The film package layer comprises an inorganic material package layer 012 and an organic material package layer 011, and the inorganic material package layer 012 are disposed as an entire surface and have a uniform thickness, so the inorganic material package layer 012 has no effect on the difference value between the optical lengths of the paths. The organic material package layer 011 fills the pixel opening full. After fully filling the pixel opening, an entire package layer is formed. Therefore, in different paths, the thickness of the organic material package layer is different. Therefore, the optical length of the path to be passed by the light can be adjusted by adjusting the thickness of the organic material package layer 011 within the pixel opening or the refractive index of the organic material package layer, or the thickness and refractive index of the organic material package layer can also be adjusted at the same time, or other methods can be used together to adjust. The thickness of the organic material package layer in path A is greater than the thickness of the organic material package layer in other paths.

The plurality of light-transmitting paths can be formed in the display panel. The path may comprise a packaging layer, a second electrode layer, a light emitting structure layer, a first electrode layer, and a substrate; and/or the path may comprise a packaging layer, a second electrode layer, a light emitting structure layer, a pixel defining layer, and a substrate; and/or the path may comprise a packaging layer, a second electrode layer, a light-emitting structure layer, a pixel-defining layer, conductive lines, and a substrate. There may be more paths formed if the distribution of multiple lines at different positions and the distribution of pixel circuits are considered. According to the idea of the present application, as long as the thickness and/or the refractive index of one or more film layers which are different from each other in each different path are adjusted to realize that the difference value between the optical lengths of at least two paths is an integer multiple of the wavelength of the light, a diffraction of the light after passing through at least two paths can be reduced. The more paths meet the requirements, the better the diffraction can be reduced. Optionally, one or more difference values between the optical lengths can be an integer multiple of the wavelength of the light by adjusting the thickness and/or the refractive index of one or more layers of the package layer, the light-emitting structure layer, the first electrode layer, the pixel-defining layer, the insulating layer, and the conductive line. The specific adjustment manners have been separately described in the above embodiments, which will not be repeated here.

Figure 8:
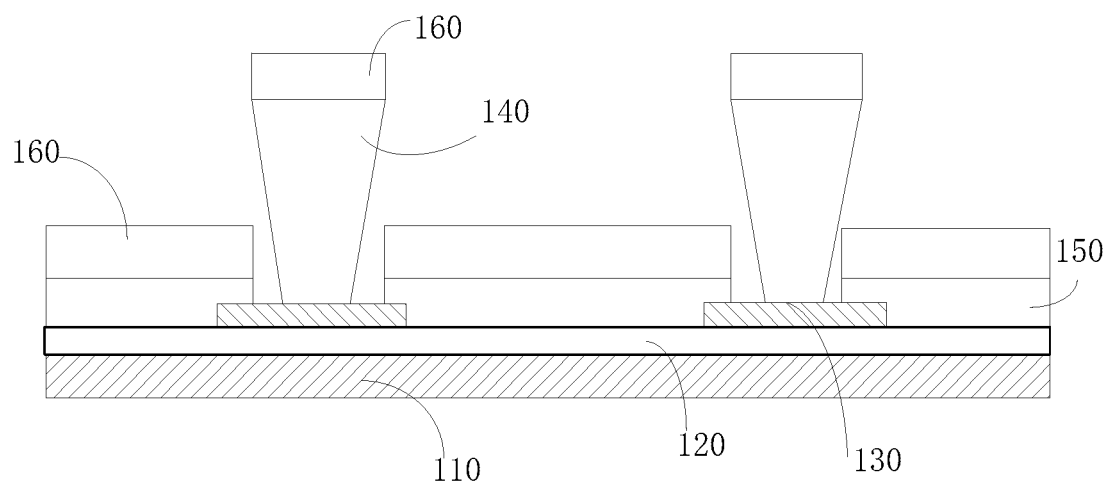
FIG. 8 is a schematic structural view of a cathode of a display panel in an embodiment of the present application.
Figure 9:
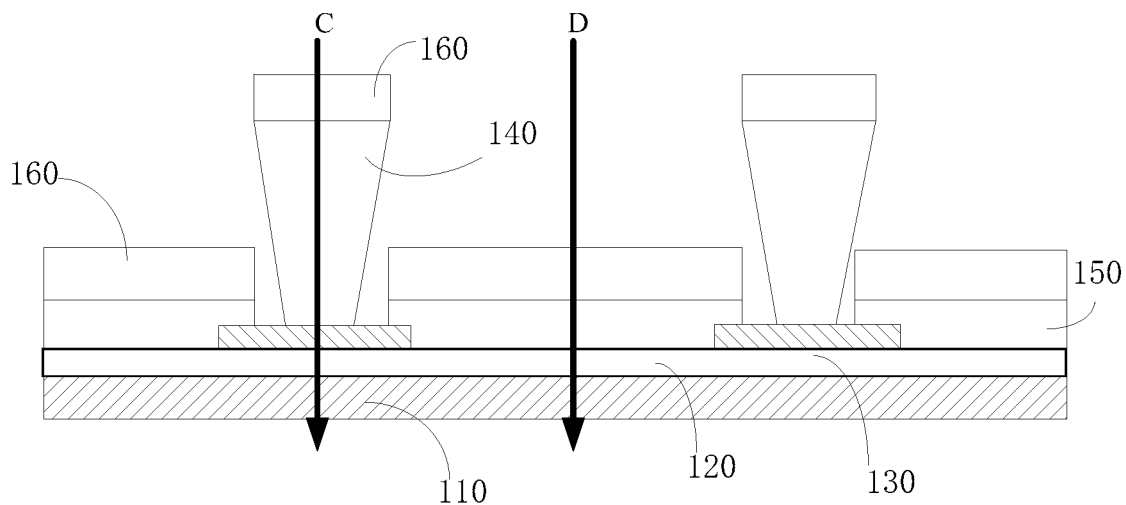
FIG. 9 is a schematic structural view of light passing through a cathode in an embodiment of the present application.

Optionally, the display panel can be PMOLED. Since the PMOLED and the AMOLED have different structures, when light passes through PMOLED, there are different paths to be formed. As shown in FIG. 8, the PMOLED comprises a substrate 110, an anode layer 120, a pixel defining layer 130, an isolation column 140, a light emitting structure layer 150, and a cathode layer 160. The anode layer 120 comprises a plurality of first electrodes, and a plurality of anodes are regularly arranged on the substrate 110. A light emitting structure layer 150 is formed on the anode, and a cathode layer 160 is formed on the light emitting structure layer 150. The isolation column 140 is formed on the pixel defining layer 130 and is disposed between adjacent first electrodes. The isolation column 140 is used to separate the cathodes of two adjacent sub-pixel regions. As shown in FIG. 8, the isolation column 140 has an inverted trapezoidal structure and made of a transparent material, such as transparent photoresist. The surface of the isolation column 140 is higher than the surface of the adjacent region. Therefore, when a cathode is prepared on the surface of the display panel, the cathode formed above the isolation column 140 is disconnected from the cathode on the adjacent pixel regions, thereby realizing phase separation of the cathodes of adjacent sub-pixel regions, which ultimately ensures that each sub-pixel region can be driven normally. Since the PMOLED further comprises the isolation columns 140, part of the paths through which the lights pass also comprises the isolation columns 140. As shown in FIG. 9, the path C comprises the cathode layer 160, the isolation column 140, the pixel defining layer 130, the anode layer 120, and the substrate 110, and the path D comprises the cathode layer 160, the light emitting structure layer 150, the anode layer 120, and the substrate 110. In the path C and the path D, different film layers comprise an isolation column 140, a pixel defining layer 130, a light emitting structure layer 150, and an anode layer 120. By adjusting the thickness and/or the refractive index of one or more of the layers, the difference value between the optical lengths of path C and path D to be passed by the light can be adjusted. In each path, the optical path length of the path to be passed by the light can be adjusted by adjusting the thickness and/or the refractive index of the film layers that are different with each other. Other adjustment methods of the paths are the same as those in the foregoing embodiments, and details are not repeated herein.

The path A, path B, path C, and path D in the above embodiments may also be referred to as a first path, a second path, a third path, a fourth path, and the like.

As a specific embodiment, the above-mentioned light is a visible light, and the wavelength of the light is 380-780 nanometers, preferably the wavelength of the light is 500-600 nanometers. The human eye is more sensitive to the light in this range (i.e., green light); and since the human eye is most sensitive to green light, the incident light can be selected based on green light, that is, when adjusting the optical length of each path to be passed by the light, λ can be chosen from wavelengths of 500 nm to 560 nm of the green light, such as 540 nm, 550 nm, 560 nm. Since the wavelength of green light is between red light and blue light, the red light and blue light can be taken into account when using green light.

Figure 10:
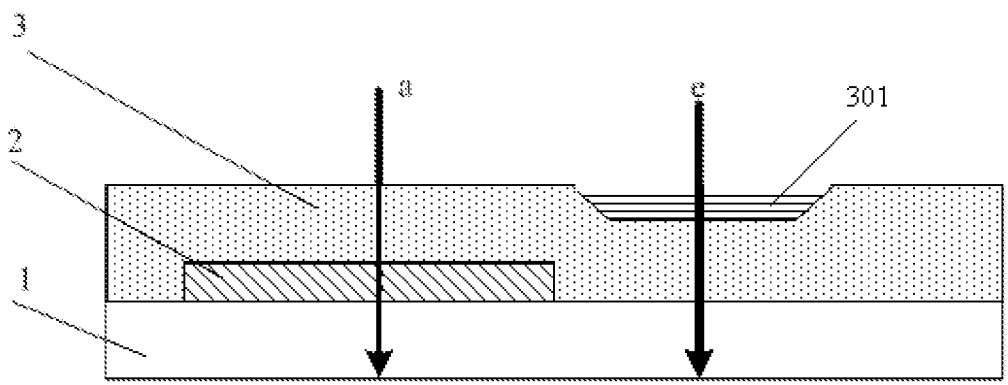
FIG. 10 is a schematic structural view of a display panel in an embodiment of the present application.

An embodiment of the present application also provides a display panel. On the basis of the display panel shown in FIG. 1, a groove 301 is formed in the second film layer 3. As shown in FIG. 10, the groove 301 is filled with a compensation material to form a compensation layer. The compensation material may be an organic transparent material, such as photoresist, and a plurality of paths through which light passes are formed in the display panel, and each path passes through different structural layers. As shown in FIG. 10, path a comprises a second film layer 3, a first film layer 2, and a substrate 1, and path e comprises a groove 301, a second film layer 3, and a substrate 1. The optical length of the path e to be passed by the light is a first optical length, and the optical length of the path a to be passed by the light is a second optical length. Since the compensation layer is provided in the groove 301, and the difference value between the first optical length and the second optical length is an integer of the wavelength of light by adjusting the thickness or refractive index of the compensation layer, or adjusting both the thickness and the refractive index of the compensation layer at the same time.

In an embodiment, the refractive indexes of light on the substrate 1, the first film layer 2, and the second film layer 3 are respectively $n_1$, $n_2$, and $n_3$, the thickness of the substrate 1 is $d_1$, the thickness of the first film layer is $d_2$, and the thickness of the groove is $d_3$, the refractive index is $n_e$; the thickness of the second film in path a is da, and the thickness of the second film in path e is de. According to the calculation formula, the optical path $L_a = n_1 \times d_1 + n_2 \times d_2 + n_3 \times d_a$; $L_e = n_e \times d_3 + n_3 \times d_e$; then $L_a - L_b = x\lambda$, x is an integer, including positive integers, negative integers, and zero.

In an embodiment, a groove 301 is disposed in the second film layer 3, and the compensation material is filled in the groove 301 to adjust the optical length of the path to be passed by the light, such that the difference value between the optical lengths of the path and the other paths is an integer multiple of the wavelength, and the phase difference of the light after passing the path a and the path b is 0, thereby avoiding a diffraction caused by the phase difference, and improving the clarity of the display panel after the light passing through the transparent display panel, and reducing the degree of distortion, and meeting the requirements of setting a camera and other photosensitive devices below a transparent screen.

As some optional embodiments, when a groove is disposed in the second film layer 3, the path can be adjusted to select a suitable position and a suitable depth according to the actual needs, or a groove with a larger depth can be disposed in advance, and when filling with the compensation material, the thickness of the compensation material is chosen according to the actual needs. One or more grooves can be provided according to actual needs, and the positions and numbers of the grooves can be reasonably set according to actual needs. In this way, the optical length of each path can be easily adjusted, such that the difference value between the optical lengths of the paths can meet the requirements.

As a preferred embodiment, by disposing a groove at a specific position, the difference value between the optical lengths of any two paths in the display panel to be passed by the lights is an integer multiple of the wavelength of light. In this way, after the light passes through the display panel, no phase difference will occur in all paths, and no diffraction phenomenon caused by the phase difference will occur, thereby reducing diffraction.

Figure 11:
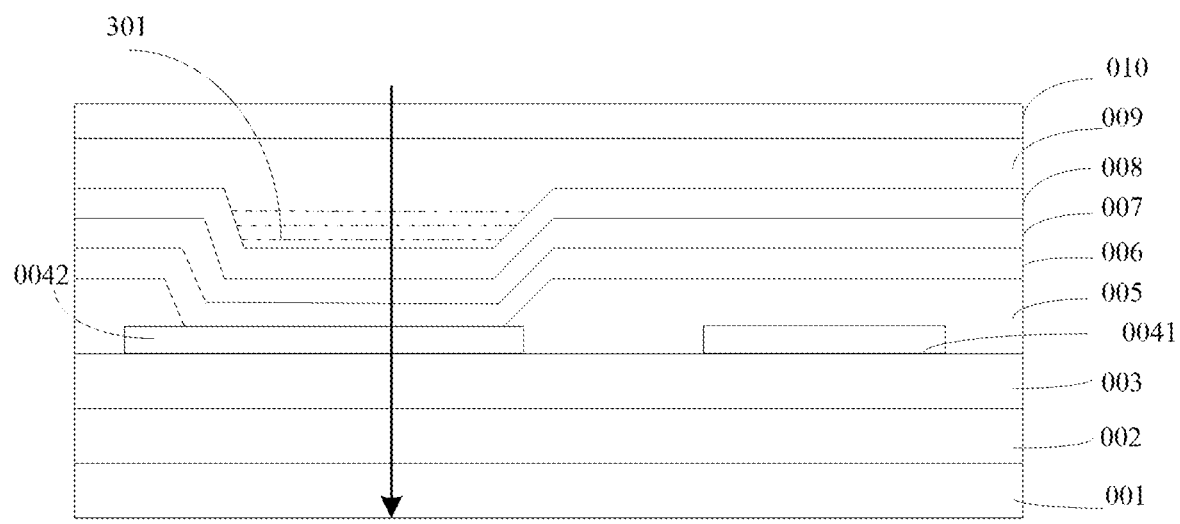
FIG. 11 is a schematic structural view of a display panel in another embodiment of the present application.

In a specific embodiment, for an AMOLED display panel, the groove 301 may also be a pixel opening in a pixel-defining layer. By multiplexing the pixel opening and filling a compensation material inside the pixel opening, the optical length of the path to be passed by the light can be adjusted. As shown in FIG. 11, the structure of the display panel is the same as that of the display panel shown in FIG. 5. The structure of the rest part of the display panel has been described before, and will not be repeated here. In the pixel opening formed by the pixel defining layer 005, a light emitting structure layer 006, a cathode layer 007, and optional a light extraction layer 008 are sequentially arranged. These film layers are prepared by evaporation method, and the bottom and edges of the pixel opening are evaporated with one film layer. After these film layers are formed, the pixel opening is still provided with a groove 301 inside, and the depth of the groove 301 is equal to the depth of the pixel opening. A compensation material is disposed in the groove 301 of the pixel opening, and the thickness of the compensation material may be less than or equal to the depth of the groove 301. In this technical solution, the optical length of the path to be passed by the light is adjusted by multiplexing the groove formed in the pixel opening. The thickness of the compensation material filled in the groove may be smaller than the thickness of the groove. The difference value between the optical lengths of the path and other paths is an integer multiple of the wavelength of the light by adjusting the thickness or refractive index of the compensation material, or adjusting the thickness and refractive index of the compensation material at the same time, and thereby adjusting the optical lengths of the paths to be passed by the lights.

In the display panel shown in FIG. 11, a method of hard package layer is used. After the compensation material is filled, a vacuum gap layer is formed on the external side of the light extraction layer 008 and the compensation material, and the outermost side is the package substrate. The path by which the light passes through the compensation material in the display panel comprises a package substrate 010, a vacuum gap layer 009, a compensation material, a light extraction layer 008, a cathode layer 007, a light emitting structure layer 006, a anode layer 0042, a planarization layer 003, a laminate 002 and a substrate 001. A hard screen package is suitable for a glass substrate to form a hard screen display panel.

Figure 12:
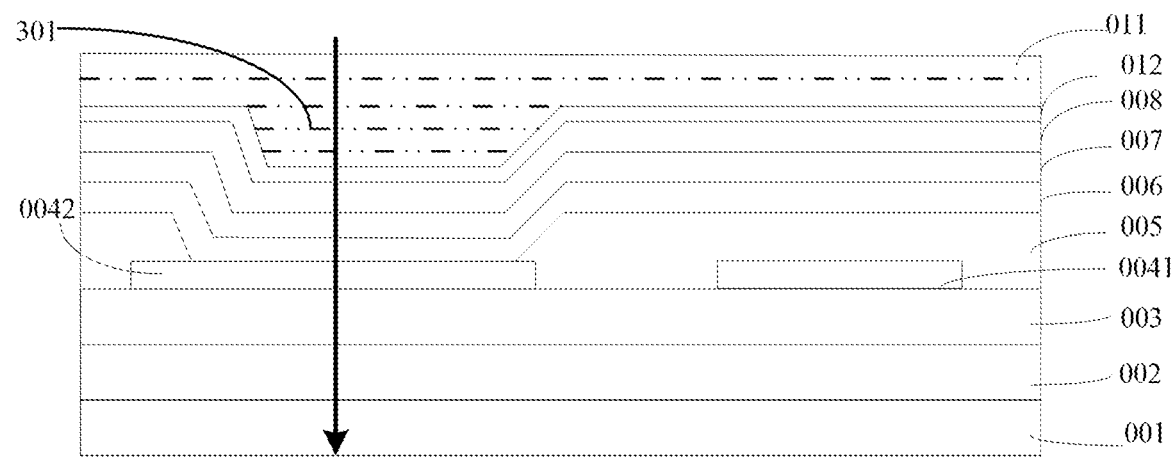
FIG. 12 is a schematic structural view of a display panel in another embodiment of the present application.

In other embodiments, when a thin film package method is used, a compensation material filled in a groove 301 of the pixel opening may be a package material, which is performed by a thin-film package method without using a separate processing method. As shown in FIG. 12, the thin film package layer comprises an inorganic material package layer 012 and an organic material package layer 011 disposed on the external side of the light extraction layer 008.

Since the inorganic material package layer 012 is formed by evaporated as a whole layer, the thicknesses are the same in each path through which the light passes, so it will not affect the difference value between the optical lengths of the paths. Since the organic material layer is often formed by inkjet printing or film formation evaporation method, the thickness of different regions can be adjusted as required. Therefore, when packaging, the organic packaging material will flow into the groove 301 and fill the groove to the full to form an entire surface of organic material package layer 011. In this way, the organic material in the groove is used as a compensation material, and the groove is filled to the full, and the thickness of the compensation material is equal to the thickness of the groove. The thickness or refractive index of the filled organic material can be adjusted, or the thickness and the refractive index can be adjusted at the same time, such that the optical length of the path to be passed by the light can be adjusted. The path by which the light pass through the groove 301 comprises an organic material package layer 011, an inorganic material package layer 012, a light extraction layer 008, a cathode layer 007, a light emitting structure layer 006, an anode layer 0042, a planarization layer 003, a stack 002, and a substrate 001. The thin film package method is suitable for flexible substrates.

Figure 13:
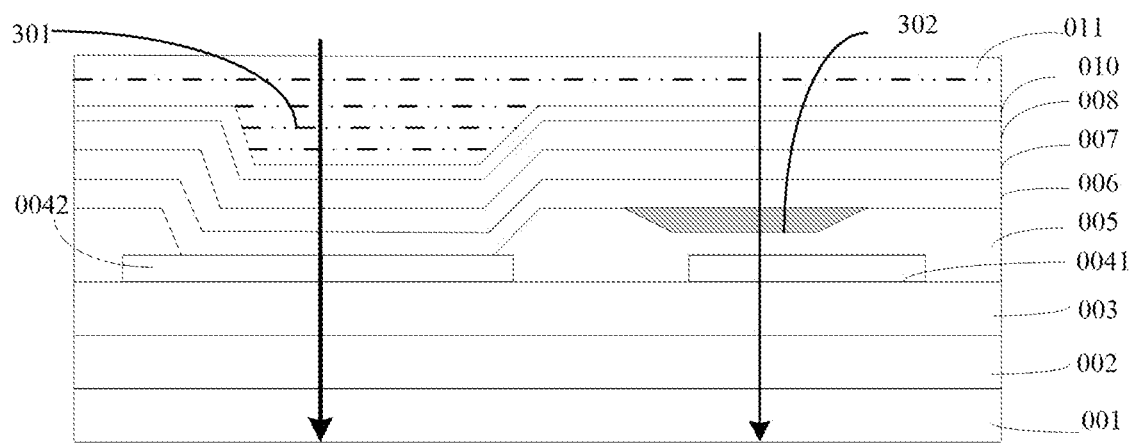
FIG. 13 is a schematic structural view of a display panel in another embodiment of the present application.

As another embodiment, in the technical solution of FIG. 11 or FIG. 12, one or more grooves may be provided in the pixel defining layer 005 or other film layers, for adjusting the optical length of the path to be passed by the light. As shown in FIG. 13, based on the structure of the display panel in FIG. 12, one or more grooves 302 are provided in the pixel defining layer 005, and compensation materials are filled in the grooves 302. The thickness of the grooves 302 can be determined as required. By adjusting the thickness or refractive index of the compensation material, or adjusting the thickness and the refractive index at the same time, the optical length of the path to be passed by the light can be adjusted such that the difference value between the optical lengths of the path and other paths is an integer multiple of the wavelength.

As other combinable embodiments, the methods of adjusting the thickness and/or the refractive index of each film layer described in the foregoing embodiments can be combined with the method of adjustment by providing grooves in this embodiment. By such combination, the difference value between the optical lengths of the path and other paths mentioned in the above embodiment is the integer multiple of wavelength of the light.

Figure 14:
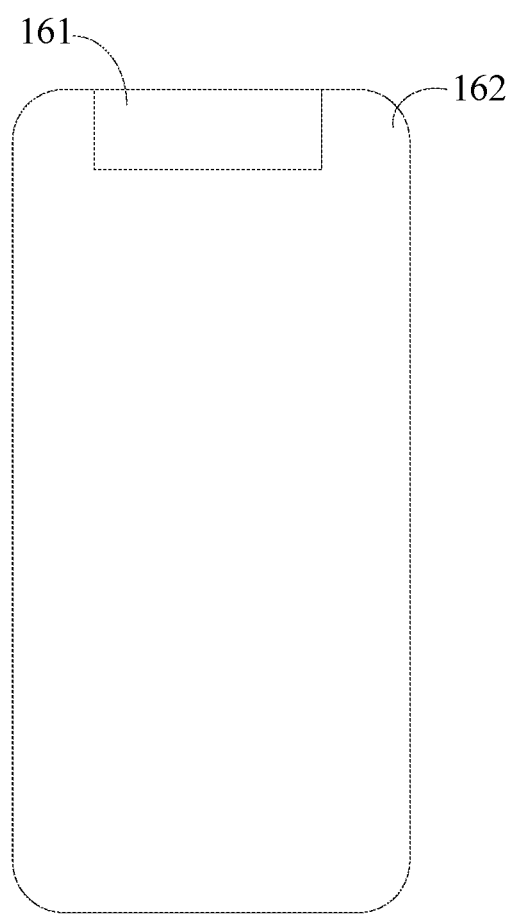
FIG. 14 is a schematic structural view of a display screen in an embodiment of the present application.

The present embodiment of the present application also provides a display screen, as shown in FIG. 14, the display screen comprises a first display area 161 and a second display area 162, and the first display area 161 and the second display area 162 are both used to display static or dynamic picture, and the display panels mentioned in any of the above embodiments are used in the first display area 161 and the first display area 161 is located at an upper part of the display screen. In the above display panel, after lights pass through the display panel via at least two of the paths, it will not cause phase differences, and diffraction interference is reduced. If the phases do not change after the lights pass through all the paths in the display panel, the diffraction interference caused by the phase difference can be avoided, and the camera below the screen can capture clear and true image information.

Optionally, the display screen may further comprise three or more display areas, such as three display areas (a first display area, a second display area, and a third display area). The display panel mentioned in any of the above embodiments can be used in the first display area, and display panels used in the second display area and the third display area not limited, and the display panel can be a PMOLED display panel or an AMOLED display panel, and certainly the display panel of the present embodiment can also be used.

The present embodiment further provides a display apparatus, comprising the above display screen overlaid on the apparatus body. The display apparatus may be a product or a component having a display function, such as a mobile phone, a tablet PC, a television, a display screen, a palmtop computer, an iPad, a digital camera, a navigator, or the like.

Figure 15:
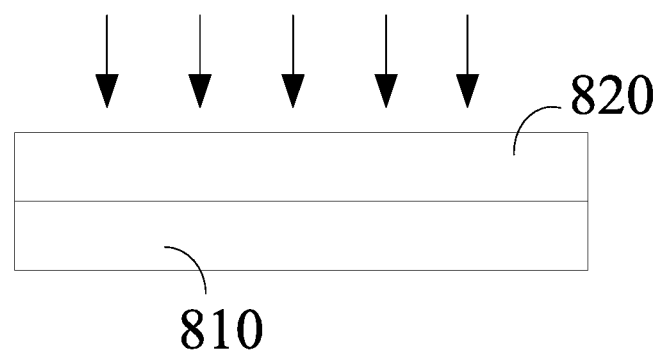
FIG. 15 is a schematic view of a terminal structure in an embodiment of the present application.

FIG. 15 shows a schematic structural view of a display terminal, the display terminal comprises an apparatus body 810 and a display screen 820. The display screen 820 is disposed on the apparatus body 810 and is interconnected with the apparatus body 810. The display screen 820 can be the display screen in any of the above embodiments for displaying a static or dynamic picture.

Figure 16:
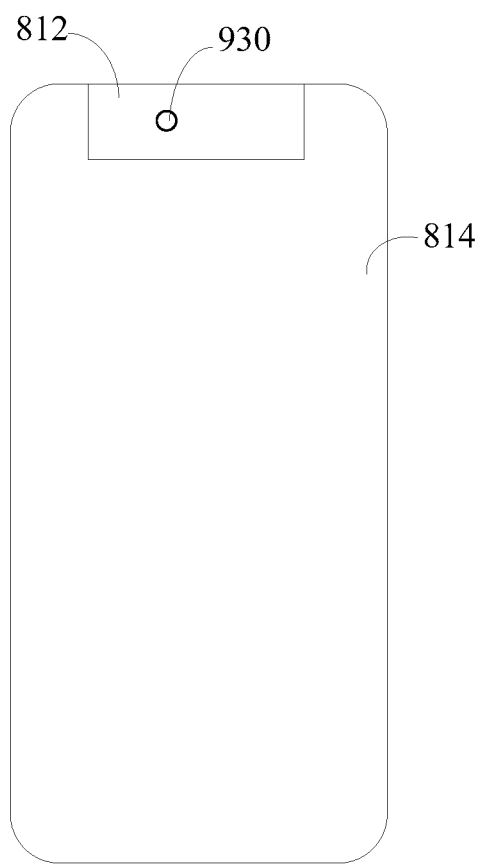
FIG. 16 is a schematic view of an apparatus body according to an embodiment of the present application.

FIG. 16 shows a schematic structural view of an apparatus body 810. The apparatus body 810 can be provided with a groove area 812 and a non-groove area 814. A photosensitive device such as a camera 930 and an optical sensor, may be disposed in the groove area 812. At this time, the display panel of the first display area of the display screen 820 is attached to the device area 812 so that the above-mentioned photosensitive device such as the camera 930 and the optical sensor can collect external light through the first display area. Since the display panel in the first display area can effectively improve the diffraction phenomenon generated by the external light passing through the first display area, thereby effectively improving the quality of the image captured by the camera 930 on the display terminal, and avoiding the image distortion of the image captured due to diffraction, while also improving the accuracy and sensitivity of the light sensor for sensing external light.

While the embodiments of the present application have been described with reference to the drawings, various modifications and variation can be made by those skilled in the art without departing from the spirit and scope of the application. Such modifications and variations fall within the scope defined by the claims.

The invention claimed is:

1. A display panel, comprising:
   a substrate, and
   a plurality of film layers disposed on the substrate in sequence, and at least one of the film layers having a patterned structure, wherein
   the display panel has a plurality of light transmitting paths, the number of the light transmitting paths is m, m is an integer greater than or equal to 2, the light transmitting paths extend along a direction orthogonal to a surface of the substrate, the plurality of light transmitting paths include a first path and a second path comprising different film layers of the plurality of film layers, when a thickness of the different film layers is set to a preset thickness and/or when a refractive index is set to a preset refractive index, the display panel allows an externally incident light to enter therein along a direction orthogonal to the surface of the substrate, and pass through the first path and the second path, and a difference value obtained between optical lengths of the first path and the second path is an integer multiple of a wavelength of the externally incident light;
   at least one of the different film layers through which the first path passes defines a groove, the groove has a compensation layer disposed therein, the compensation layer is made from a transparent material layer with a thickness less than or equal to a depth of the groove, and the first path longitudinally passes through the groove and the compensation layer;

the display panel is an active matrix organic light emitting diode display panel or a passive matrix organic light emitting diode display panel, and the different film layers comprise a package layer, a second electrode layer, a light emitting layer, a first electrode layer, and a pixel defining layer;

the first path comprises the package layer, the compensation layer, the second electrode layer, the light emitting layer, the first electrode layer, and the substrate;

the second path comprises the package layer, the second electrode layer, the pixel defining layer, the first electrode layer, and the substrate; and the light transmitting paths also comprise a third path comprising the package layer, the second electrode layer, the pixel defining layer, and the substrate.

2. The display panel according to claim 1, wherein, the display panel allows the externally incident light to enter therein along a direction orthogonal to the surface of the substrate and pass through any two paths of the plurality of light transmitting paths, and a difference value between optical lengths of the first path and the second path is an integer multiple of a wavelength of the externally incident light.

3. The display panel according to claim 1, wherein the display panel has the following setting:

$$L_1 = d_1 * n_1 + d_2 * n_2 + \ldots + d_i * n_i,$$

$$L_2 = D_1 * N_1 + D_2 * N_2 + \ldots + D_j * N_j,$$

$$L_1 - L_2 = a\lambda, \text{ wherein,}$$

$L_1$ represents the optical length of the externally incident light along the first path, i is a natural number representing the number of the different film layers being passed through by the externally incident light, $d_1$, $d_2$, ... $d_i$ respectively represent the thicknesses of the different film layers being passed through, and the $n_1$, $n_2$, ... $n_i$ respectively represent refractive index of the different film layers being passed through;

$L_2$ represents the optical length of the externally incident light along the second path, j is a natural number representing to the number of the different film layers being passed through $D_1$, $D_2$, ... $D_i$ respectively represent the thicknesses of the different film layers being passed through, and $N_1$, $N_2$, ..., $N_i$ respectively represent the refractive index of the different film layers being passed through;

$L_1 - L_2$ represents a difference value between optical lengths of externally incident light along the first path and the second path, $\lambda$ represents the wavelength of the externally incident light; and when the thickness of the different film layers being passed through is set to the preset thickness and the refractive index is set to the preset refractive index, the mark 'a' in the '$L_1 - L_2 = a\lambda$' is an integer.

4. The display panel according to claim 3, wherein, when $d_1 * n_1 + d_2 * n_2 + \ldots + d_i * n_i = D_1 * N_1 + D_2 * N_2 + \ldots + D_j * N_j$, the difference value of the optical lengths of the first path and the second path is 0.

5. The display panel according to claim 1, wherein the display panel is the active matrix organic light emitting diode display panel, and the different film layers further comprise a conductive line, and the conductive line is a single-layer line or a multilayer line, and the conductive line comprises at least one of a scanning line, a data line, a power line, and a reset line; and the light transmitting paths further comprise a fourth path comprising the package layer, the second electrode layer, the pixel defining layer, the conductive line, and the substrate.

6. The display panel according to claim 5, wherein the conductive line is a single-layer line, the conductive line is disposed on the same layer as the first electrode layer, and the conductive line and the first electrode layer are made of the same material, and the fourth path and the second path comprise the same film layers with the same thickness; or the conductive line is the multilayer line, and at least one layer of the multilayer line is disposed on the same layer as the first electrode layer, and the conductive line and the first electrode layer are made of the same material or different materials.

7. The display panel according to claim 6, wherein the conductive line is a double-layer line comprising a first conductive line and a second conductive line disposed on the same layer, and the second conductive line is disposed between a planarization layer and the substrate, and the first conductive line and the second conductive line are made of the same material as the first electrode layer, and the fourth path comprises the package layer, the second electrode layer, the pixel defining layer, the first conductive line and/or the second conductive line, and the substrate.

8. The display panel according to claim 7, wherein when a projection of the conductive line on the substrate partially overlaps with a projection of the first electrode layer on the substrate, the light transmitting paths further comprise a fifth path comprising the package layer, the second electrode layer, the light emitting layer, the first electrode layer, the second conductive line, and the substrate.

9. The display panel according to claim 5, wherein, the display panel is the active matrix organic light emitting diode display panel, and the different film layers further comprise a support layer disposed on the pixel defining layer and a thin film transistor structure layer for manufacturing a pixel circuit, and the support layer is a transparent structure, and at least one of the second path, the third path, and the fourth path further comprises the support layer and/or the thin film transistor structure layer, or the support layer is an opaque structure, and the thin film transistor structure layer is disposed below the support layer.

10. The display panel according to claim 5, wherein, after adjusting the thickness and/or the refractive index of one or more film layers that are different with each other in the first and second paths, the externally incident light passes through the first and second paths, and the resulting difference value between the optical lengths of the first and second paths is an integer multiple of the wavelength of the externally incident light.

11. The display panel according to claim 1, wherein the display panel allows the externally incident light to enter therein along a direction orthogonal to the surface of the substrate and pass through the first path and the third path, and the difference value of the optical lengths of the first path and the third path obtained is an integer multiple of the wavelength of the externally incident light.

12. The display panel according to claim 1, wherein
the display panel is a passive matrix organic light emitting diode display panel, and the different film layers further comprise an isolation column disposed on the pixel defining layer, and the light transmitting paths further comprise a sixth path comprising the second electrode layer, the isolation column, the pixel defining layer, and the substrate, and the isolation column is made of transparent material.

13. The display panel according to claim 1, wherein:
the display panel is a flexible screen or a hard screen encapsulated with a thin film, the package layer comprises a thin film package layer comprising an organic material package layer, and the compensation layer is made of the organic material for encapsulation, and the thickness of the organic material package layer in the first path is greater than the thickness of the organic material package layer in other paths of the plurality of light emitting paths; or
the display panel is a hard screen encapsulated with a glass powder, the package layer comprises a vacuum gap layer and a package substrate, and the thickness of the vacuum gap layer in the first path is greater than or equal to the thickness of the vacuum gap layer in other paths of the plurality of light transmitting paths.

14. The display panel according to claim 1, wherein the wavelength of the externally incident light is 380 to 780 nanometers.

15. The display panel according to claim 14, wherein the wavelength of the externally incident light is 500-600 nanometers.

16. The display panel according to claim 15, wherein the wavelength of the externally incident light is 550 nanometers.

17. A display screen, comprising at least one display area; and the at least one display area comprising a first display area, and a photosensitive device disposed below the first display area; wherein
the display panel according to claim 1 is disposed in the first display area, and the at least one display area is used to display a dynamic or static picture.

18. A display terminal, comprising:
an apparatus body, having a device area;
the display screen of claim 17, covering the apparatus body;
wherein the device area is located below the first display area and provided with a photosensitive device for collecting light through the first display area; and
the device area is a groove area, and the photosensitive device comprises a camera and/or a light sensor.

* * * * *